United States Patent [19]

Itoh et al.

[11] Patent Number: 4,942,320
[45] Date of Patent: Jul. 17, 1990

[54] TRANSISTOR CIRCUIT WITH IMPROVED α RAY RESISTANT PROPERTIES

[75] Inventors: Hiroyuki Itoh, Kodaira; Toshio Yamada, Kokubunji; Akira Masaki, Musashino; Tohru Kobayashi, Iruma, all of Japan

[73] Assignee: Hitachi, Ltd., Tokyo, Japan

[21] Appl. No.: 208,118

[22] Filed: Jun. 17, 1988

[30] Foreign Application Priority Data

Jun. 19, 1987 [JP] Japan ................. 62-151115

[51] Int. Cl.⁵ .................... H03K 5/00; H03K 3/01
[52] U.S. Cl. ...................... 307/546; 307/308; 307/296.4; 307/443
[58] Field of Search ........... 307/278, 308, 542, 567, 307/546, 443, 572, 296.4, 455

[56] References Cited

U.S. PATENT DOCUMENTS

| | | | |
|---|---|---|---|
| 4,536,665 | 8/1985 | Dayton | 307/455 |
| 4,755,693 | 7/1988 | Suzuki et al. | 307/278 |
| 4,771,191 | 9/1988 | Estrada | 307/455 |
| 4,791,325 | 12/1988 | McGinn | 307/546 |
| 4,792,706 | 12/1988 | Ovens et al. | 307/455 |
| 4,810,900 | 3/1989 | Okabe | 307/278 |

Primary Examiner—Stanley D. Miller
Assistant Examiner—Richard Roseen
Attorney, Agent, or Firm—Antonelli, Terry, Stout & Kraus

[57] ABSTRACT

A transistor circuit of this invention comprises a first transistor for receiving a first bias at its base, resistor means connected to the collector of the first transistor and clamp means connected to the junction between the first transistor and the resistor means, and obtains an output from a terminal of the resistor on the opposite to its junction with the first transistor. When a noise current due to α rays develops in the first transistor and the output is lowered, the clamp means operates in such a manner that the current flows through the clamp means and prevents the change of the output. The transistor circuit of this invention is connected to a resistor or a transistor and operates as a constant current circuit for supplying a current to the resistor or the transistor so that the current flowing therethrough becomes constant. For example, it is used as a constant current source of an emitter follower to constitute a level shift circuit. It is disposed in a feedback part and used as a constant current source in a logic circuit comprising a logic part consisting of a differential transistor circuit and the feedback part for negatively feeding back the in-phase output of the differential transistor circuit.

42 Claims, 7 Drawing Sheets

TRANSISTOR CIRCUIT WITH IMPROVED α RAY RESISTANT PROPERTIES

BACKGROUND OF THE INVENTION

This invention relates to a transistor circuit, and more particularly to an improved transistor circuit capable of preventing its wrong operation due to α rays and the like that are emitted from a trace amount of radioactive substances contained in a packaging material of a semiconductor.

Figure 6:
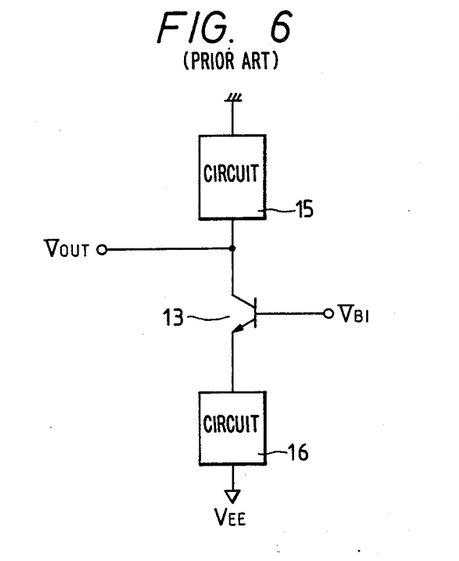
FIGS. 6 and 7 are circuit diagrams showing the prior art examples.
Figure 7:
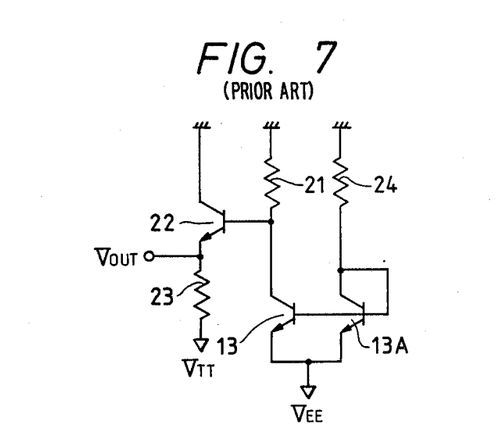
Figure 8:
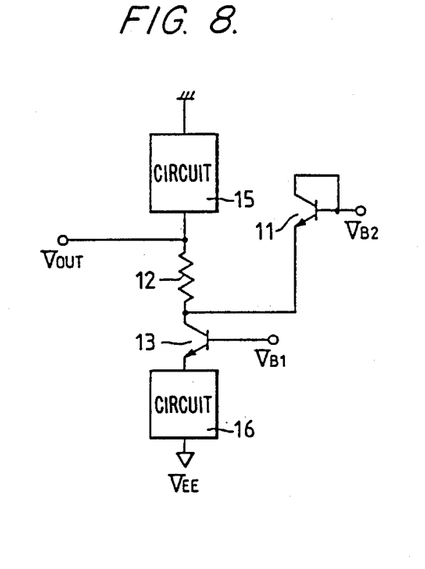
FIGS. 8 to 15 show variation of the embodiments shown in FIGS. 1, 3, 4 and 5 using diode clamping arrangements.
Figure 9:
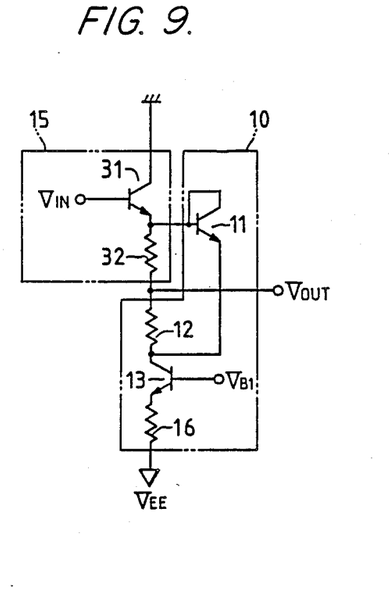
Figure 10:
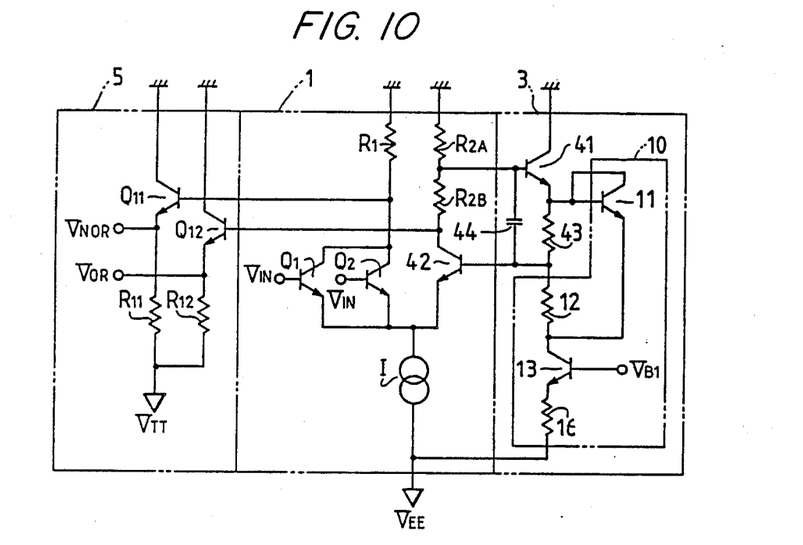
Figure 11:
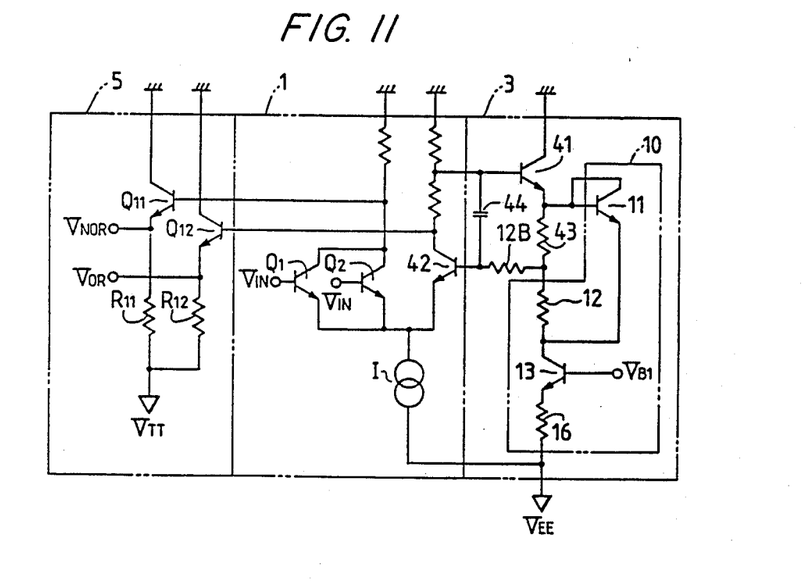
Figure 12:
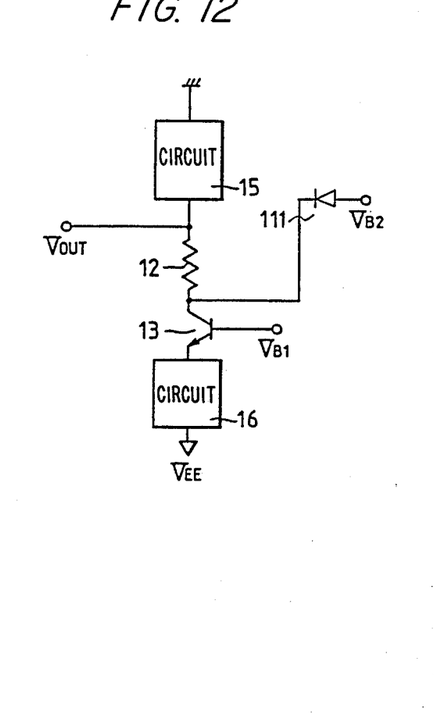
Figure 13:
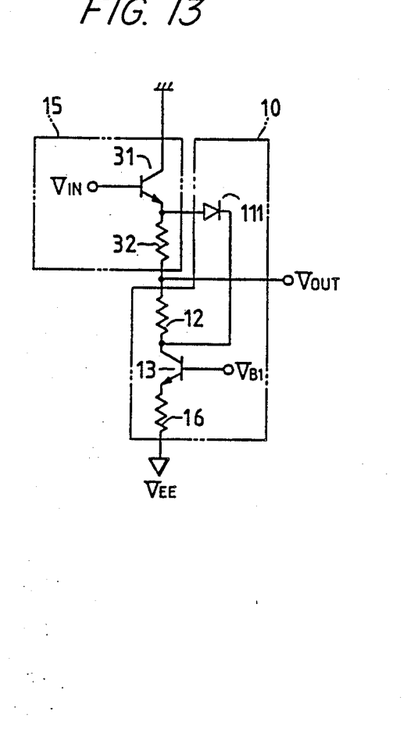
Figure 14:
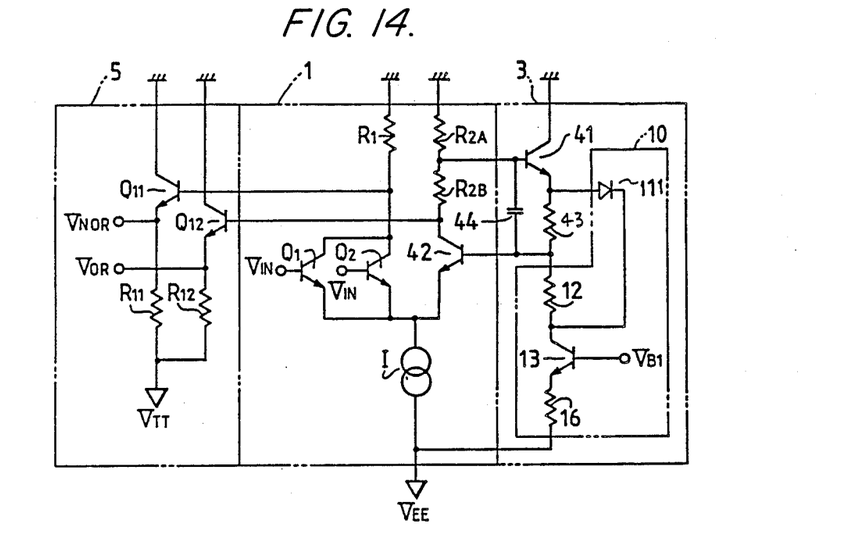
Figure 15:
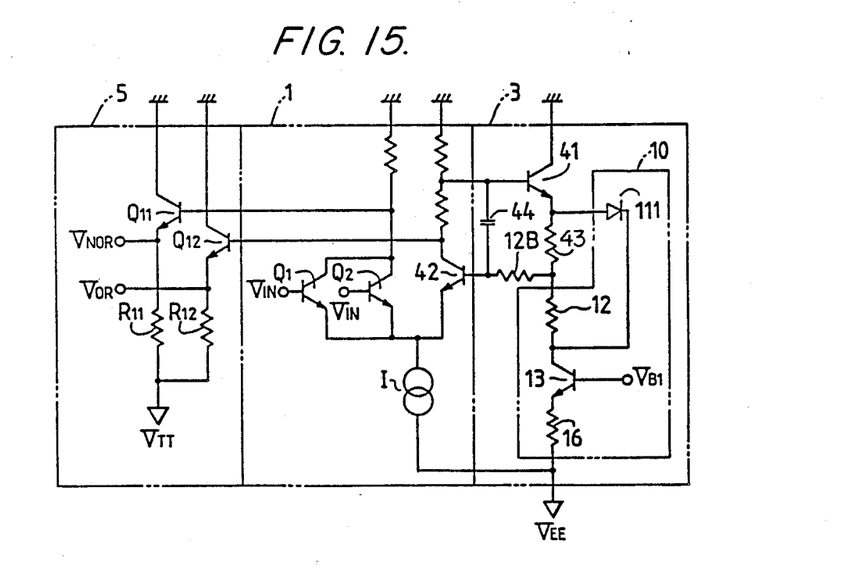

A circuit configuration such as shown in FIG. 6 of the accompanying drawings has often been employed conventionally in those circuits which are composed of transistors. Circuits 15, 16 and a transistor 13 exist between a ground potential and a power supply voltage $V_{EE}$ and a vias $V_{B1}$ is applied to the base of the transistor 13 so as to obtain a desired voltage $V_{out}$ from its collector. As a more definite example, FIG. 7 shows a constant current circuit. Namely, transistors 13, 13A and resistors 21, 24 form a constant current circuit and a constant voltage $V_{out}$ is obtained through an emitter follower 22. In comparison with the circuit shown in FIG. 6, the resistor 21 corresponds to the circuit 15.

However, this prior art technique does not take into consideration external noise, particularly the influences of α rays. If the α rays are incident to the transistor 13 in FIG. 6, critical influences are exerted on the voltage $V_{out}$. In other words, a noise current flows from the collector of the transistor 13 to a substrate (not shown) of an integrated circuit when the α rays are incident to the transistor 13. Accordingly, particularly when the impedance of the circuit 15 is great, the voltage $V_{out}$ is temporarily reduced greatly from the set value. This noise causes a wrong operation of the circuit using the voltage $V_{out}$. In FIG. 7, the noise current flows from the resistor 21 and the collector of the transistor 13 to the substrate with the result being the drop of the base potential of the transistor 22 as well as in the drop of the voltage $V_{out}$.

Incidentally, the mechanism of the noise current due to the incidence of the α rays into the transistor is described in detail in U.S. Ser. No. 020,892 (filed on Mar. 2, 1987) and this reference proposes an improved flip-flop circuit which prevents the occurrence of soft errors by the α rays.

SUMMARY OF THE INVENTION

It is therefore an object of the present invention to provide a transistor circuit which eliminates the influences of the α rays and prevents its wrong operation.

It is another object of the present invention to provide a constant current source circuit capable of generating a desired voltage without the influences of the α rays and a logic circuit using such a constant current source circuit.

The transistor circuit in accordance with the present invention is characterized by including a first transistor which receives a first bias at its base, resistor means connected to the collector of the first transistor and clamp means connected to the junction between the first transistor and the resistor means, and obtaining an output from the terminal of the resistor means on the opposite side to its junction with the first transistor. When a noise current due to the rays is generated in the first transistor and the output is reduced, the clamp means operates in such a manner that the noise current flows through the clamp means and the output change is thereby impeded.

The transistor circuit in accordance with the present invention is connected to a resistor or a transistor and operates as a constant current source circuit which supplies the current to the resistor or the transistor so that the current flowing through it becomes constant. The transistor circuit of the invention is used as a constant current source of an emitter follower, for example, and constitutes a level shift circuit. In a logic circuit consisting of a logic part formed of a differential transistor circuit and a feedback part for the negative feedback of the in-phase output of the differential transistor circuit, the transistor circuit is used as a constant current source disposed in the feedback part. In other words, this feedback part consists of a feedback circuit which receives the in-phase output of the differential transistor circuit and feeds it back negatively to the base of an out-of-phase input transistor of the differential transistor circuit and a constant current source circuit which supplies a current to this feedback circuit. This constant current circuit consists of a constant current source transistor which receives a bias at its base, resistor means and clamp means connected to the collector of this transistor, respectively. The resistor means is connected to the feedback circuit and is constructed in such a manner that the current flowing through the feedback circuit becomes constant irrespective of the influences of the α rays.

DESCRIPTION OF THE PREFERRED EMBODIMENTS

Figure 1:
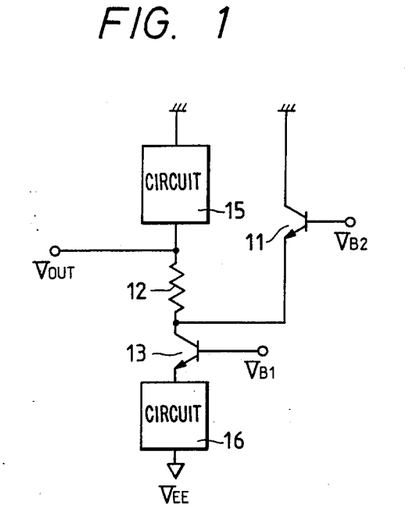
FIG. 1 is a circuit diagram showing the fundamental construction of a transistor circuit in accordance with the present invention.

FIG. 1 is a circuit diagram showing the fundamental construction of the transistor circuit in accordance with the present invention and representing the application of the present invention to the circuit construction shown in FIG. 6. The present invention is constituted by adding a transistor 11 operating as a clamp circuit and a resistor 12 to the circuit shown in FIG. 6. During a normal operation (or when no noise current due to the α rays flows), a voltage $V_{out}$ is determined by a circuit 15. Therefore, the original circuit operation is not at all affected by the existence of the resistor 12. A bias $V_{B2}$ is set so that hardly any current flows through the clamp transistor 11.

When the α rays are incident to the collector of the transistor 13, the noise current flows to the substrate from the circuit 15 and the resistor 12 through the collector of the transistor 13. As a result, a voltage drop occurs across both ends of the resistor 12 and a current flows through the transistor 11. If the value of the resistor 12 is set to a greater value than the impedance of the circuit 15, the potential at the upper end of the resistor 12, i.e. the variation of the output voltage $V_{OUT}$, can be reduced drastically even when the potential at the lower end of the resistor 12 changes and the transistor 11 becomes conductive.

In accordance with the present invention described above, when the noise current due to the α rays develops in the transistor which receives the bias at its base and provides a desired voltage at its collector and when the desired voltage is lowered, the noise current flows through the clamp circuit and prevents the change of the desired voltage.

Figure 2:
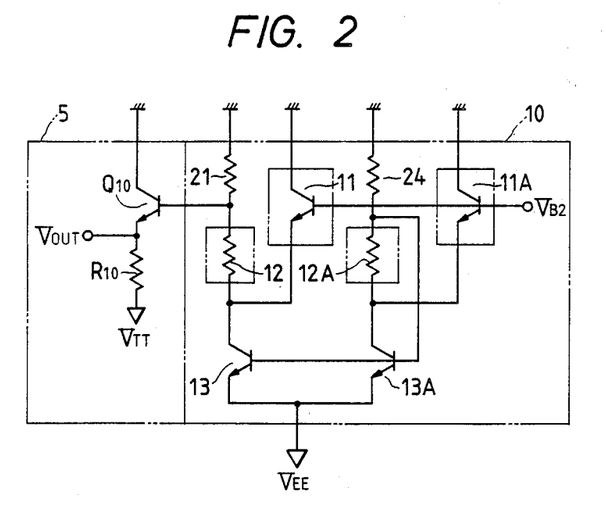
FIG. 2 is a circuit diagram showing an example of a constant current circuit as one embodiment of the transistor circuit of the present invention.

FIG. 2 shows an example of the constant current circuit as an embodiment of the transistor circuit of the present invention and represents the application of the invention to the constant current shown in FIG. 7. This circuit consists of a constant current circuit part 10 and a driver part 5 which receives the output of the constant current circuit part and outputs a constant voltage $V_{OUT}$. The constant current circuit part 10 consists of transistors 11, 11A, 13, 13A and resistors 21, 12, 24, 12A, and its positive power source side is connected to a ground potential with its negative power source side being connected to $V_{EE}$. The driver part 5 forms an emitter follower consisting of a transistor $Q_{10}$ and a resistor $R_{10}$. The base of the transistor $Q_{10}$ receives the output of the constant current circuit part 10 and its emitter provides the constant voltage $V_{OUT}$. The positive power source of the deriver part 5 is the ground potential and the negative power source, $V_{TT}$.

In FIG. 7, it is the transistors 13 and 13A for a constant current source that are affected by the rays. Therefore, in this embodiment, a transistor 11 and a resistor 12 are added to the transistor 13 and a transistor 11A and a resistor 12A are added to the transistor 13A. It is thus possible to reduce drastically the change of $V_{OUT}$ in the same way as in FIG. 1 even when the α rays are incident to the transistor 13 or 13A.

Figure 3:
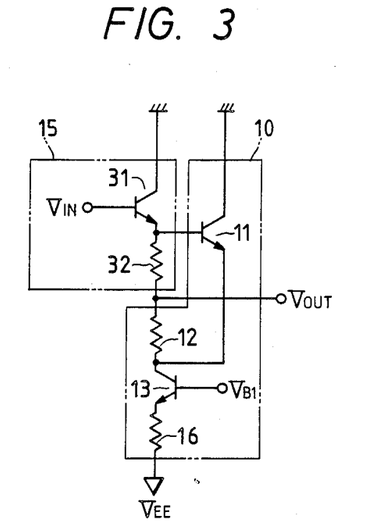
FIG. 3 is a circuit diagram showing an example of a level shift circuit as another embodiment of the transistor circuit of the present invention.

FIG. 3 shows an example of a level shift circuit as another embodiment of the transistor circuit of this invention. This level shift circuit uses, as the circuit 15 shown in FIG. 1, an emitter follower consisting of a transistor 31 which receives the input $V_{IN}$ at its base and a resistor 32 one of the ends of which is connected to the emitter of this transistor 31 and whose other end is connected to the resistor 12. The constant current circuit part 10 consists of a transistor 13 which receives the bias $V_{B1}$ at its base, a resistor 16 one of the ends of which is connected to the emitter of the transistor 13 and the other end of which is connected to a negative power source $V_{EE}$, a resistor 12 one of the ends of which is connected to the collector of the transistor 13 and the other end of which is connected to a resistor 32 and a clamp transistor 11 the collector of which is connected to a positive power source (ground potential) and which receives the output of the emitter follower 15 at its base. The level shift circuit supplies a constant current to the resistor 32.

The level shift is effected originally by the transistor 31 and the resistor 32 and the output $V_{OUT}$ can be obtained from the input $V_{IN}$. In other words, the voltage across the base and emitter of the transistor 31 is substantially constant, the voltage drop of the resistor 32 is constant due to the constant current by the transistor 13 and the level shift circuit can thus be accomplished. However, since the transistor 13 is not highly resistant to the α rays, the present invention adds the transistor 11 and the resistor 12. As a result, the output $V_{OUT}$ is hardly affected by the rays that are incident to the transistor 13, in the same way as in FIGS. 1 and 2.

Figure 4:
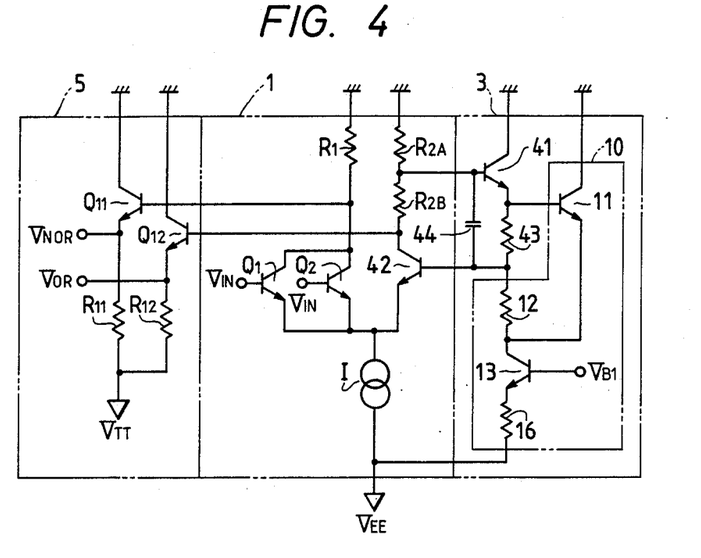
FIG. 4 is a circuit diagram showing an example of a logic circuit as another embodiment of the transistor circuit of the present invention.

FIG. 4 shows an example of a logic circuit as still another embodiment of the transistor circuit of the present invention. This embodiment represents the application of the present invention to the logic circuit proposed by U.S. patent specification No. 4,609,837, and the constant current circuit 10 in the feedback part 3 of this reference uses the present invention. This logic circuit consists of a logic part 1, a feedback part 3 and a driver part 5. The logic part 1 consists of a differential transistor circuit consisting in turn of transistors $Q_1$, $Q_2$ 42 and resistors $R_1$, $R_{2A}$, $R_{2B}$, and a constant current source I for supplying a constant current to this differential transistor circuit. The positive power source side of this logic part 1 is connected to the ground potential and its negative power source side, to $V_{EE}$. The driver part 5 consists of two emitter followers that are composed of a transistor $Q_{11}$ with a resistor $R_{11}$ and a transistor $Q_{12}$ with a resistor $R_{12}$, respectively. These emitter followers receive the out-of-phase output and in-phase output of the differential transistor circuit and output $V_{NOR}$ and $V_{OR}$, respectively. The positive power source of the driver part 5 is at the ground potential and the negative power source is $V_{TT}$. The logic part 1 and the driver part 5 of this logic circuit have the same structure as that of an ordinary ECL (Emitter Coupled Logic). The feedback part 3 consists of a feedback circuit consisting in turn of a transistor 41, a resistor 43 and a capacitor 44 and a constant current circuit 10 for supplying a constant current to this feedback circuit, and its positive power source side and negative power source side are connected to the ground potential and $V_{EE}$ as the same power source of the logic part 1.

The feedback circuit includes a transistor 41 which receives the in-phase output of the differential transistor circuit and a resistor 43 connected to the emitter of this transistor 41. The resistor 43 is connected to the base of the out-of-phase input transistor 42 in the differential transistor circuit and also to the constant current circuit 11 and is constructed such that the current flowing through the transistor 41 and the resistor 43 becomes constant and the in-phase output of the differential transistor circuit is fed back negatively to the base of the out-of-phase transistor 42. A capacitor 44 is disposed between the base of the transistor 41 and the base of the out-of-phase input transistor 42 in order to suppress the noise at the time of changeover of the current and to improve response of the base potential.

This logic circuit operates in such a manner as to obtain an OR or NOR logic output $V_{OR}$, $V_{NOR}$ by comparing the voltage applied to the base of the out-of-phase input transistor 42 with the voltage applied to the bases of the in-phase input transistors $Q_1$, $Q_2$. The base voltage of the transistor 42 is provided by the feedback circuit consisting of the transistor 41 and the resistor 43. The feedback voltage to the base of the transistor 42 due to the power source voltage variations and to the temperature variations can be compensated for by changing the base voltage $V_{B1}$ of the transistor 13 in the constant current circuit 10.

When the α rays are incident into the transistor 13 in this logic circuit, the noise current flows, as described already. Therefore, the voltage applied to the base of the transistor 42 changes greatly and the logic circuit causes the wrong operation. Incidentally, since the current flowing through the transistors $Q_1$, $Q_2$, 42 constituting the differential transistor is greater than the current flowing through the transistor 13 for the constant current source, there occurs no critical problem even when the α rays are incident into these transistors $Q_1$, $Q_2$, 42 and the noise current flows.

Accordingly, when the transistor 11 and the resistor 12 are added to the collector of the transistor 13 in accordance with the present invention, the adverse influences of the α rays can be avoided almost perfectly by exactly the same operation as in FIGS. 1 to 3. In this embodiment, the base voltage of the clamp transistor 11 is connected to the emitter of the transistor 41 to apply its voltage but not to apply the bias voltage $V_{B2}$. This is because since the base potential of the transistor 42 to be clamped varies with the logic operation, $V_{B2}$ cannot be made to be a fixed voltage. However, since the current flowing through the resistor 43 is a constant current, the potential difference across both ends of the resistor 43 can be clamped.

Although the number of inputs is two in this embodiment, the circuit of the invention can receive three or more inputs, too. Since the output is taken out through the emitter follower, the wired OR circuit can be formed at the output portion of the circuit of the present embodiment.

Figure 5:
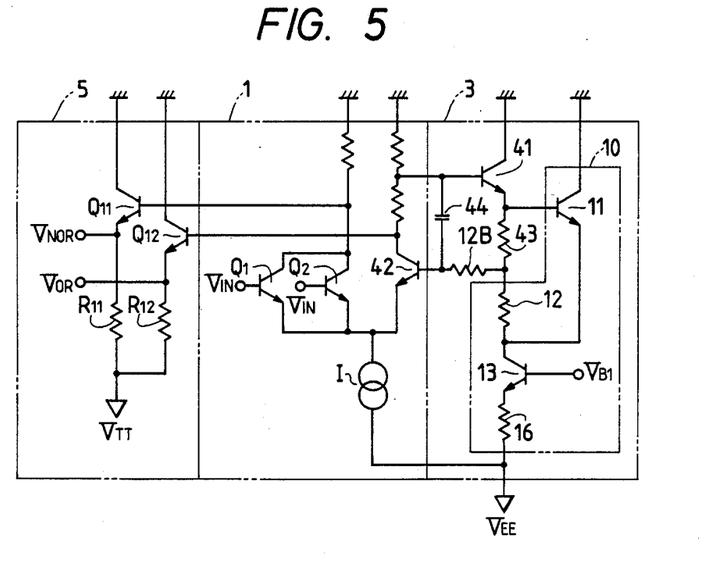
FIG. 5 is a circuit diagram showing an improved example of the logic circuit shown in FIG. 4.

FIG. 5 shows still another embodiment of the present invention. In comparison with the circuit shown in FIG. 4, a resistor 12B is further added between the base of the transistor 42 and the resistor 43 in this embodiment. In FIG. 4, the transient noise current due to the α rays flows from the capacitor 44 through the resistor 12. Since the node which is to be originally clamped is not the junction between the resistors 43 and 12 but is the base of the transistor 42. Therefore, the circuit arrangement shown in FIG. 5 may be employed.

Although the foregoing embodiments consider the clamp operation between the base and emitter of the transistor, this can be replaced obviously by the anode and cathode of a diode. In other words, the transistor 11 in the embodiment shown in FIG. 1 can be operated as the diode by connecting the collector of the transistor 11 to its base but not to the ground potential and applying the bias $V_{B2}$ also to the collector, and the same effect as in FIG. 1 can thus be obtained. Furthermore, the same effect can be obtained obviously by preparing a diode having an anode and cathode in place of the transistor 11 and connecting the anode to $V_{B2}$ and the cathode to the collector of the transistor 13. In the embodiments shown in FIGS. 4 and 5, too, the same effect can be obtained and the object of the invention can be accomplished by connecting the collector of the transistor 11 to its base, that is, the emitter of the transistor 41. Such diode clamping arrangements are shown in FIGS. 8 to 15.

In accordance with the present invention described above, it is possible to constitute a transistor circuit which can extremely reduce any adverse influences of the α rays.

What is claimed is:

1. A transistor circuit comprising:

a first circuit means having at least a first resistor means and providing an output from one end of said first resistor means;

a first transistor having a base which receives a first bias;

second resistor means connected between a collector of said first transistor and the one end of said first resistor means; and clamp means connected to the collector of said first transistor and clamping a voltage between the collector of said first transistor and the other end of said first resistor means.

2. A transistor circuit according to claim 1, wherein said clamp means comprises a transistor having a base which receives a second bias and having an emitter which is connected to the collector of said first transistor.

3. A transistor circuit according to claim 1, wherein said clamp means comprises a diode having an anode which receives a second bias and having a cathode connected to the collector of said first transistor.

4. A transistor circuit according to claim 1, which further comprises a second transistor having a base for receiving said first bias, third resistor means having one end connected to a collector of said second transistor, second clamp means connected to the collector of said second transistor, and fourth resistor means connected to the other end of said third resistor means, and wherein a voltage obtained at a junction between said fourth resistor means and said third resistor means due to a current flowing through said fourth resistor means is supplied as said first bias to the bases of said first and second transistors.

5. A transistor circuit according to claim 1, which further comprises an emitter follower transistor having a base for receiving said output.

6. A transistor circuit according to claim 4, which further comprises an emitter follower transistor having a base for receiving said output.

7. A transistor circuit according to claim 1, wherein said first circuit means further comprises a second transistor having a base for receiving an input and having an emitter connected to the other end of said first resistor means, and wherein said output is obtained by level-shifting said input.

8. A transistor circuit according to claim 7, wherein said clamp means comprises a transistor having a base and emitter connected to the other end of said first resistor means and to the collector of said first transistor, respectively.

9. A transistor circuit according to claim 1, which further comprises a logic part including a differential transistor circuit for comparing an input signal with a reference voltage, and wherein said first circuit means includes a second transistor having a base for receiving an in-phase output of said differential transistor circuit and having an emitter connected to the other end of said first resistor means and wherein said first circuit means operates as a feedback circuit for providing said output of said first circuit means as said reference voltage to said differential transistor circuit.

10. A transistor circuit according to claim 9, wherein said first circuit means further comprises capacitor means connected between the base of said second transistor and a node at which said differential transistor circuit receives said reference voltage.

11. A transistor circuit according to claim 10, wherein said first circuit means further comprises third resistor means connected between the one end of said first resistor means and said node.

12. A transistor circuit according to claim 9, which further comprises an emitter follower transistor for receiving a collector signal of an out-of-phase input transistor in said differential transistor circuit.

13. A transistor circuit according to claim 9, which further comprises an emitter follower transistor for receiving a collector signal of an in-phase input transistor in said differential transistor circuit.

14. A transistor circuit according to claim 1, wherein said clamp means comprises a transistor having a base and a collector coupled to a second bias and having an emitter connected to the collector of said first transistor.

15. A transistor circuit according to claim 7, wherein said clamp means comprises a diode having an anode and cathode connected to the other end of said first resistor means and to the collector of said first transistor, respectively.

16. A transistor circuit according to claim 7, wherein said clamp means comprises a transistor having a base and a collector connected to the other end of said first resistor means and having an emitter connected to the collector of said first transistor.

17. A transistor circuit comprising:
a constant current circuit comprising a first transistor having a base which receives a first bias, first resistor means having one end connected to a collector of said first transistor, and clamp means connected to the collector of said first transistor; and
a first circuit having at least second resistor means and obtaining an output at one end of said second resistor means connected to the other end of said first resistor means when the current supplied from said constant current circuit flows through said second resistor means, wherein said clamp means clamps a voltage between the one end of said first resistor means and the other end of said second resistor means.

18. A transistor circuit according to claim 17, which further comprises an emitter follower transistor having a base for receiving the output of said first circuit.

19. A transistor circuit according to claim 17, wherein said first circuit further comprises a second transistor having a base for receiving an input and having an emitter connected to the other end of said second resistor means, and wherein the output of said first circuit is obtained by level-shifting said input.

20. A transistor circuit according to claim 19, wherein said clamp means comprises a transistor having a base connected to the other end of said second resistor means and having an emitter connected to the collector of said first transistor.

21. A transistor circuit according to claim 17, which further comprises a logic part including a differential transistor circuit for comparing an input signal with a reference signal, and wherein said first circuit includes a second transistor having a base for receiving an in-phase output of said differential transistor circuit and having an emitter connected to the other end of said second resistor means, wherein said first circuit is comprised of a feedback circuit providing an output thereof as said reference signal to said differential transistor circuit.

22. A transistor circuit according to claim 21, wherein said first circuit further comprises capacitor means connected between the base of said second transistor and a node at which said differential transistor circuit receives said reference signal.

23. A transistor circuit according to claim 22, wherein said first circuit further comprises third resistor means connected between the other end of said second resistor means and said node.

24. A transistor circuit according to claim 21, which further comprises an emitter follower transistor coupled to receive a collector signal of an out-of-phase input transistor in said differential transistor circuit.

25. A transistor circuit according to claim 21, which further comprises an emitter follower transistor coupled to receive a collector signal of an in-phase input transistor in said differential transistor circuit.

26. A transistor circuit according to claim 21, wherein said clamp means comprises a transistor having a base connected to the emitter of said second transistor and having an emitter connected to the collector of said first transistor.

27. A transistor circuit according to claim 21, wherein said clamp means comprises diode means having a cathode connected to the collector of said first transistor and having an anode connected to the emitter of said second transistor.

28. A logic circuit according to claim 21, wherein said clamp means comprises diode means having a cathode connected to the collector of said second transistor and having an anode connected to the emitter of said first transistor.

29. A transistor circuit according to claim 21, wherein said clamp means comprises a transistor having a base and a collector connected to the other end of said second resistor means and having an emitter connected to the collector of said first transistor.

30. A logic circuit comprising:
a logic part including a differential transistor circuit for comparing at least one input signal with a reference voltage;
a feedback circuit including a first transistor having a base for receiving an in-phase output of said differential transistor circuit and first resistor means having one end connected to an emitter of said first transistor; and
a feedback part comprising a constant current circuit for supplying a constant current to said feedback circuit, said constant current circuit comprising a second transistor having a base for receiving a predetermined bias, second resistor means having one end connected to a collector of said second transistor and the other end connected to the other end of said first resistor means, and clamp means connected to the collector of said second transistor, said clamp means clamping a voltage between the collector of said second transistor and the one end of said first resistor means,
said feedback part providing said reference voltage to said differential transistor circuit from a junction between said first and second resistor means.

31. A logic circuit according to claim 30, wherein said feedback circuit further comprises capacitor means connected between the base of said first transistor and a node at which said differential transistor circuit receives said reference voltage.

32. A logic circuit according to claim 31, wherein said clamp means comprises a transistor having a base and a collector connected to the one end of said first resistor means and having an emitter connected to the collector of said second transistor.

33. A transistor circuit according to claim 31, wherein said feedback circuit further comprises third resistor means connected between the other end of said first resistor means and said node.

34. A logic circuit according to claim 31, which further comprises an emitter follower transistor coupled to a collector signal of an out-of-phase input transistor in said differential transistor circuit.

35. A logic circuit according to claim 31, which further comprises an emitter follower transistor coupled to receive a collector signal of an in-phase input transistor in said differential transistor circuit.

36. A logic circuit according to claim 31, wherein said clamp means comprises a transistor having a base connected to the emitter of said first transistor and having an emitter connected to the collector of said second transistor.

37. A logic circuit comprising:

a logic part including a differential transistor circuit for comparing at least one input signal with a reference voltage;

a feedback part comprising a feedback circuit which includes a first transistor having a base for receiving an in-phase output of said differential transistor circuit and first resistor means having one end connected to an emitter of said first transistor, and a constant current circuit for supplying a constant current to said feedback circuit, said constant current circuit comprising a second transistor having a base for receiving a predetermined bias, second resistor means having one end connected to a collector of said second transistor and the other end connected to the other end of said first resistor means, and clamp means connected between the collector of said second transistor and the one end of said first resistor means, said clamp means clamping a voltage between the collector of said second transistor and the one end of said first resistor means, said feedback part providing said reference voltage to said differential transistor circuit from a junction between said first and second resistor means; and a driver part including at least one of a first emitter follower transistor for receiving a collector signal of an out-of-phase input transistor in said differential transistor circuit and a second emitter follower transistor for receiving a collector signal of an in-phase input transistor in said differential transistor circuit.

38. A logic circuit according to claim 37, wherein said feedback circuit further comprises capacitor means connected between the base of said first transistor and a node at which said differential transistor circuit receives said reference voltage.

39. A transistor circuit according to claim 38, wherein said feedback circuit further comprises third resistor means connected between the other end of said first resistor means and said node.

40. A logic circuit according to claim 37, wherein said clamp means comprises a transistor having a base connected to the emitter of said first transistor and having an emitter connected to the collector of said second transistor.

41. A logic circuit according to claim 37, wherein said clamp means comprises diode means having a cathode connected to the collector of said second transistor and having an anode connected to the emitter of said first transistor.

42. A logic circuit according to claim 37, wherein said clamp means comprises a transistor having a base and a collector connected to the one end of said first resistor means and having an emitter connected to the collector of said second transistor.

* * * * *